(12) United States Patent
Yoshizaki et al.

(10) Patent No.: US 7,193,317 B2
(45) Date of Patent: Mar. 20, 2007

(54) SEMICONDUCTOR MODULE AND POWER CONVERSION DEVICE

(75) Inventors: Atsuhiro Yoshizaki, Hitachinaka (JP);
Keiichi Mashino, Hitachinaka (JP);
Hiromichi Anan, Nishiibaraki (JP);
Yoshitaka Ochiai, Hitachi (JP)

(73) Assignees: Hitachi, Ltd., Tokyo (JP); Hitachi Car Engineering Co., Ltd., Hitachinaka (JP)

( * ) Notice: Subject to any disclaimer, the term of this patent is extended or adjusted under 35 U.S.C. 154(b) by 11 days.

(21) Appl. No.: 10/610,816

(22) Filed: Jul. 2, 2003

(65) Prior Publication Data

US 2004/0104446 A1 Jun. 3, 2004

(30) Foreign Application Priority Data

Jul. 3, 2002 (JP) ............................. 2002-194078

(51) Int. Cl.
*H01L 23/367* (2006.01)
(52) U.S. Cl. ............................... 257/713; 257/E23.102
(58) Field of Classification Search ................ 257/712, 257/713, 717, 718, 722, 721, E23.102
See application file for complete search history.

(56) References Cited

U.S. PATENT DOCUMENTS

| | | | | |
|---|---|---|---|---|
| 5,396,403 A | * | 3/1995 | Patel | ........................... 361/705 |
| 5,591,789 A | * | 1/1997 | Iruvanti et al. | ............. 523/515 |
| 6,072,240 A | | 6/2000 | Kimura et al. | |
| 6,442,033 B1 | * | 8/2002 | Liu et al. | ..................... 361/743 |
| 6,538,308 B1 | * | 3/2003 | Nakase et al. | ............... 257/675 |
| 6,627,997 B1 | * | 9/2003 | Eguchi et al. | .............. 257/777 |
| 6,697,257 B1 | * | 2/2004 | Wolf et al. | .................. 361/708 |
| 6,891,265 B2 | * | 5/2005 | Mamitsu et al. | ............. 257/718 |
| 6,916,433 B2 | * | 7/2005 | Mitani et al. | ................ 252/500 |

FOREIGN PATENT DOCUMENTS

| | | |
|---|---|---|
| DE | 19932953 A1 | 1/2000 |
| DE | 19950026 A1 | 4/2001 |
| DE | 10009171 A1 | 9/2001 |
| EP | 1014451 A1 | 6/2000 |
| EP | 1111677 A2 | 6/2001 |
| FR | 2786657 | 6/2000 |
| JP | 08-008395 | 1/1996 |
| JP | 09-098582 | 4/1997 |
| JP | 2000-091485 | 3/2000 |
| JP | 2000-174180 | 6/2000 |
| JP | 2001-156225 | 6/2001 |
| JP | 2002-008451 | 1/2002 |
| WO | WO 01/27997 A2 | 4/2001 |

OTHER PUBLICATIONS

European Search Report Mailed Feb. 24, 2004.

* cited by examiner

*Primary Examiner*—Carl Whitehead, Jr.
*Assistant Examiner*—Jennifer M Dolan
(74) *Attorney, Agent, or Firm*—Crowell & Moring LLP

(57) ABSTRACT

One method of achieving the above subjects is by connecting a block member 14, which is connected to the side opposite to that of a semiconductor chip 11 having insulating substrates 12 and 13 connected to the top and bottom of the semiconductor chip 11, to a block member 15 across an laminated structure constituted by the semiconductor chip 11 and the insulating substrates 12 and 13.

3 Claims, 7 Drawing Sheets

SEMICONDUCTOR MODULE AND POWER CONVERSION DEVICE

BACKGROUND OF THE INVENTION

The present invention relates to a semiconductor module and a power conversion device using the same.

Some types of power conversion devices comprise a semiconductor module in which chip-like semiconductor devices are mounted in packaged IC form. A large majority of power conversion devices, however, comprise a semiconductor module in which semiconductor devices are mounted as they are. The latter is intended to improve the cooling effect of the semiconductor module by directly releasing the heat emitted from the semiconductor devices.

Examples of the products known as semiconductor modules of this conventional type are disclosed in Japanese Laid-Open Patent Publication No. Hei 10-56131. Various products designed so that the heat emitted from the respective semiconductor chips is released from the two principal faces of each semiconductor chip are proposed in Japanese Laid-open Patent Publication No. Hei 10-56131. These products include, for example, a semiconductor module having each semiconductor chip sandwiched between insulating substrates and having these insulating substrates further sandwiched between copper plates so that the heat emitted from the semiconductor chip is released from the two principal faces thereof.

SUMMARY OF THE INVENTION

For the power conversion devices used under a severe heat-cycle environment, such as the power conversion device mounted in an automobile, as the standards pertaining to power supplies are tightened, the magnitude of the current flowing through semiconductor devices increases and this, in turn, increases the heat emitted from the semiconductor devices and makes the heat cycle even severer.

It is therefore demanded that the cooling performance of the semiconductor modules constituting the power conversion device should be further improved over the cooling performance of conventional semiconductor modules.

The present invention is to provide a semiconductor module that can be improved in cooling performance. The present invention is also to provide a highly reliable, compact, and inexpensive power conversion device that can maintain normal operation even when used under a severe heat-cycle environment.

In order to achieve the above, the present invention features a semiconductor module in which one of thermal-conductive members connected to the opposite side to the semiconductor device side of each insulating substrate connected to either the top or bottom of the semiconductor device is connected to the other of the thermal-conductive members, across the laminated section formed by the semiconductor element and the insulating substrates.

The present invention also features a semiconductor module in which one of thermal-conductive members connected to the opposite side to the semiconductor device side of each electroconductive member connected to either the top or bottom of the semiconductor device via an insulating member is connected to the other of the thermal-conductive members, across the laminated section formed by the semiconductor element, the electroconductive members, and the insulating members.

DESCRIPTION OF THE PREFERRED EMBODIMENTS

Figure 8:
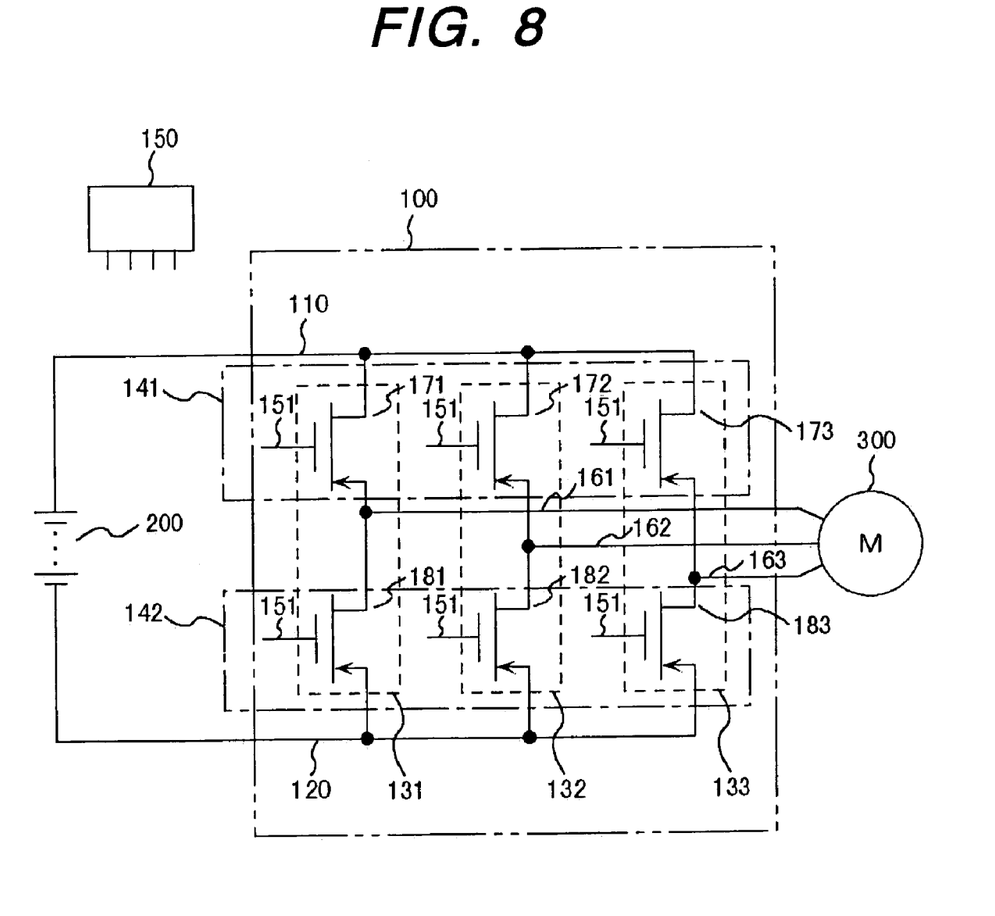
FIG. 8 is a circuit diagram showing the circuit composition of the inverter device of FIG. 1.

A first embodiment of the present invention is described below in accordance with FIGS. 1 to 8. FIG. 8 shows the circuit composition of the power conversion device pertaining to the present embodiment.

The power conversion device in the present embodiment is intended to be mounted in the motor-driving system of an automobile (for example, a motor-driving system for an electric automobile or a hybrid automobile, or a motor-driving system for automotive motor loads such as an air conditioner and brakes), and this power conversion device is described below taking as an example an inverter device 100 by which the DC power from a battery 200 (operating at, for example, a charging voltage of 42 V) is to be converted into three-phase AC power and then supplied to an AC motor 300 (for example, a synchronous motor, an induction motor, or the like).

The inverter device 100 is constructed so that the DC power of the battery 200 that has been supplied via a positive-pole DC bus 110 and a negative-pole DC bus 120 is first converted into AC power, for each phase, during the switching operation of the MOS-FETs 171, 172, 181, and 183 controlled by the gate control signal 151 of a control circuit block 150, and then supplied to the AC motor 300 via the AC output buses 161 to 163 corresponding to each phase. More specifically, conversion circuits 131 to 133 are constituted by the MOS-FETs 171 to 173 which form an upper arm 141, and the MOS-FETs 181 to 183 which form a lower arm 142.

The conversion circuit 131 of a u-phase comprises the MOS-FET 171 of the upper arm 141 and the MOS-FET 181 of the lower arm 142. The drain side of the MOSFET 171 is connected to the positive-pole DC bus 110, and the source side is connected to the AC output bus 161. The source side of the MOS-FET 181 is connected to the negative-pole DC bus 120, and the drain side is connected to the AC output bus 161.

The conversion circuit 132 of a v-phase comprises the MOS-FET 172 of the upper arm 141 and the MOS-FET 182 of the lower arm 142. The drain side of the MOSFET 172 is connected to the positive-pole DC bus 110, and the source side is connected to the AC output bus 162. The source side of the MOS-FET 182 is connected to the negative-pole DC bus 120, and the drain side is connected to the AC output bus 162.

The conversion circuit 133 of a w-phase comprises the MOS-FET 173 of the upper arm 141 and the MOS-FET 183 of the lower arm 142. The drain side of the MOSFET 173 is connected to the positive-pole DC bus 110, and the source side is connected to the AC output bus 163. The source side of the MOS-FET 183 is connected to the negative-pole DC bus 120, and the drain side is connected to the AC output bus 163.

Although the present embodiment described above uses MOS-FETs as the semiconductor devices constituting the conversion circuits, these conversion circuits can likewise be composed using other switching elements such as IGBTs or bipolar transistors.

FIGS. 1 to 5 show the configuration of an actual inverter device 100 having the circuit composition of FIG. 8. The inverter device 100 comprises: a positive-pole semiconductor module 10 forming the upper arm 141; a negative-pole semiconductor module 20 forming the lower arm 142; a busbar 30 forming a positive-pole DC bus 110, a negative-pole DC bus 120, and AC output buses 161 to 163; a base 50, and; a heat-releasing member 60.

Although the inverter device 100 further has the control circuit block 150 mentioned in connection with FIG. 8, this control circuit block is not shown in FIGS. 1 to 5. The positive-pole semiconductor module 10, the negative-pole semiconductor module 20, and the busbar 30 are arranged linearly in proximity to each other on the base 50 so that the busbar 30 is positioned between the positive-pole semiconductor module 10 and the negative-pole semiconductor module 20. The heat-releasing member 60 is connected to the bottom of the base 40. The heat-releasing member 60 is a fin-like thermal-conductive member made of a metal such as aluminum.

The positive-pole semiconductor module 10 has three semiconductor chips 11 which form the MOS-FETs 171 to 173 mentioned in connection with FIG. 8. The negative-pole semiconductor module 20 has three semiconductor chips 21 which form the MOS-FETs 181 to 183 mentioned in connection with FIG. 8.

The semiconductor chips 11 and 21 in the positive-pole semiconductor module 10 and the negative-pole semiconductor module 20, respectively, are arranged linearly in proximity to each other in a vertical direction with respect to the orienting direction of the positive-pole semiconductor module 10, the negative-pole semiconductor module 20, and the busbar 30 (hereinafter, the orienting direction of these three elements is referred to as the "first direction", and the direction in which the semiconductor chips are arranged is the same as the stretching direction of the busbar 30, and is referred to as the "second direction").

Also, in the positive-pole semiconductor module 10 and the negative-pole semiconductor module 20, the semiconductor chips 11 and 21 forming the conversion circuits of the same phase have an opposed relationship in position with respect to the first direction.

Figure 5:
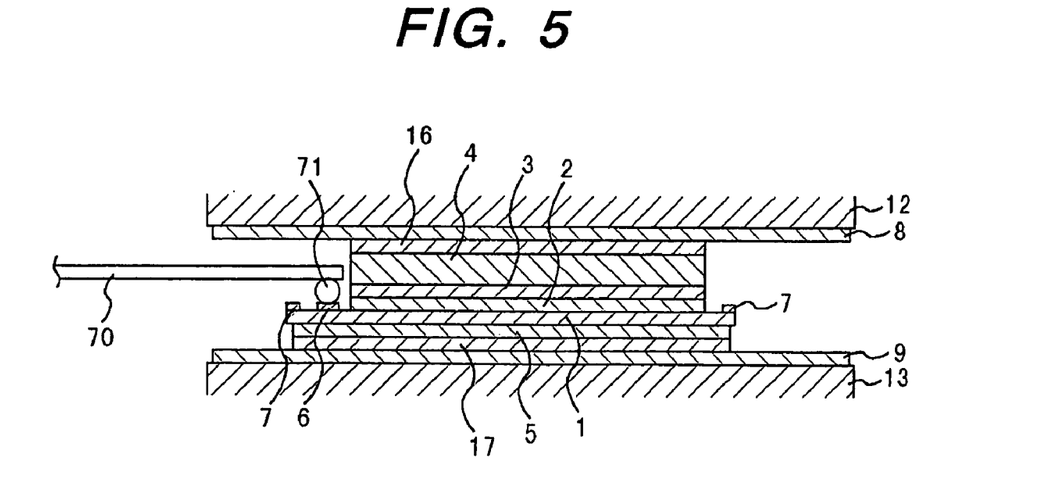
FIG. 5 is a cross-sectional view showing in enlarged form the configuration of the semiconductor chip of FIG. 4.

The semiconductor chip 11 is a flat-plate-like structure constituted by top, bottom, and four sides, and has: a silicon chip 1 consisting of a source electrode 2, a gate electrode 6 (control electrode), and a guard ring 7 at top, and a drain electrode 5 at bottom, and; a source electrode connecting member 4 connected to the source electrode 2 via solder 3.

Although the semiconductor chip 21 has the same construction as that of the semiconductor chip 11, both the top and bottom of the semiconductor chip 21 face in the opposite directions to those of the semiconductor chip 11 (that is to say, the semiconductor chip 21 is structurally rotated through 180 degrees with respect to the vertical direction of FIG. 5).

A drain electrode is positioned at the top of the semiconductor chip 21, and a source electrode, a gate electrode, and a guard ring are positioned at bottom. The source electrode connecting member 4 of the semiconductor chip 21 is a flat-plate-like electroconductive member made of a metal such as copper. The guard ring 7 is provided at the upper or lower marginal section of the silicon chip 1 and forms the boundary between the potential areas at the top and bottom of the silicon chip 1.

The semiconductor chip 11 (21) is sandwiched from the top and bottom thereof (more specifically, the top and bottom of the silicon chip 1), between the insulating substrates 12 and 13 (22 and 23) that are arranged at and connected to the top and bottom of the semiconductor chip 11 (21). The insulating substrates 12 and 13 (22 and 23) are flat-plate-like ceramic members formed from a highly heat-conductive aluminum nitride material or the like.

At the side of the insulating substrate 12 (22) that faces the top of the semiconductor 11 (21) (more exactly, the top of the silicon chip 1), in other words, at the connection side with respect to the semiconductor 11 (21), a wiring pattern 8 is formed by a metallizing or plating process. The side of the insulating substrate 12 that faces the top of the semiconductor 11 is connected to the upper side thereof (namely, the source electrode connecting member 4) via solder 16 so that the wiring pattern 8 is electrically connected to the source electrode connecting member 4.

The side of the insulating substrate 22 that faces the top of the semiconductor 21 is connected to the upper side thereof (more exactly, the top of the silicon chip 1) via solder 26 so that the wiring pattern 8 is electrically connected to the drain electrode 5. The wiring pattern 8 is a thin-plate-like or sheet-like electroconductive member made of a metal, for example, copper.

At the side of the insulating substrate 13 (23) that faces the bottom of the semiconductor 11 (21) (more exactly, the bottom of the silicon chip 1), in other words, at the connection side with respect to the semiconductor 11 (21), a wiring pattern 9 is formed by a metallizing or plating process. The side of the insulating substrate 12 that faces the bottom of the semiconductor 11 is connected to the lower side thereof (more exactly, the bottom of the silicon chip 1) via solder 17 so that the wiring pattern 9 is electrically connected,to the drain electrode 5.

The side of the insulating substrate 23 that faces the bottom of the semiconductor 21 is connected to the lower side thereof (more exactly, the source electrode connecting member 4) via solder 16 so that the wiring pattern 9 is electrically connected to the source electrode connecting member 4. The wiring pattern 9 is a thin-plate-like or sheet-like electroconductive member made of a metal (for example, copper).

In this way, in the present embodiment, double-side wired structure is implemented by sandwiching the semiconductor chip 11 (21) between, and from the sides facing the tops and bottoms of, the insulating substrates 12 and 13 (22 and 23) having the wiring patterns 8 and 9, respectively, formed by metallizing or plating. Thereby, the number of components in both the positive-pole semiconductor module 10 and the negative-pole semiconductor module 20 is minimized and wireless bonding-less processing is realized.

In the present embodiment, the above-described structure, in turn, minimizes the number of wiring connections between the components constituting the current routes of both the positive-pole semiconductor module 10 and the negative-pole semiconductor module 20, and significantly reduces risks relating to rupture and the like. According to the present embodiment, therefore, the reliability of the inverter device 100 can be improved.

Figure 4:
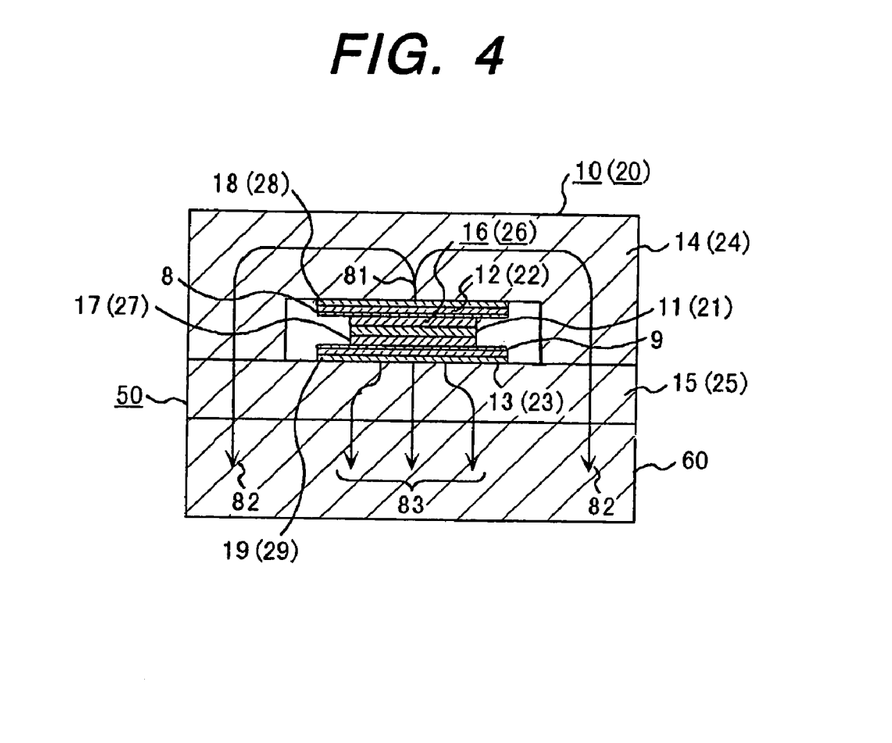
FIG. 4 is a cross-sectional view showing in enlarged form the configuration of one phase in FIG. 2.

A block member 15 (25) is disposed at the opposite side of the insulating substrate 13 (23) with respect to the semiconductor chip 11 (21). The block members 15 and 25 are made of a single, metallic (for example, copper), heat-conductive flat plate formed in common to both the positive-pole semiconductor module 10 and the negative-pole semiconductor module 20, and constitute the base 50. The side of the block member 15 (25) that faces the insulating substrate 13 (23) is connected to the opposite side thereof with respect to the semiconductor chip 11 (21), via an electroconductive adhesive 19 (29).

Although, in the present embodiment, an example in which the block members 15 and 25 are formed into a single flat plate common to both the positive-pole semiconductor module 10 and the negative-pole semiconductor module 20 has been described, the block members 15 and 25 can also be separately formed for each of the corresponding semiconductor modules.

A block member 14 (24) is disposed at the opposite side to the semiconductor chip 11 (21) of the insulating substrate 12 (22). The block members 14 and 24 are metallic (for example, copper), thermal-conductive members, and the side of the block member 14 (24) that faces the insulating substrate 12 (22) is connected to the opposite side thereof with respect to the semiconductor chip 11 (21), via an electroconductive adhesive 18 (28).

In the block member 14 (24), three through-holes are formed in parallel in a first direction. The laminated structure consisting of the semiconductor chip 11 (21) and the insulating substrates 12 and 13 (22 and 23) is connected to the central section of each through-hole in its first direction. That is to say, the block member 14 (24) is formed into a single bridge-like or arch-like member so that from an upper wall, side walls provided at both ends of the upper wall in its second direction, and two support walls by which the space between the side walls is split into three equal spaces in the second direction, the block member 14 (24) straddles the laminated structure consisting of the semiconductor chip 11 (21) and the insulating substrates 12 and 13 (22 and 23). The side walls and support walls of the block member 14 (24) are connected to the block member 15 (25).

In the three equally split spaces of the block member 14 (24), the laminated structure consisting of the semiconductor chip 11 (21) and the insulating substrates 12 and 13 (22 and 23) is stored so as to be sandwiched between the block members 14 and 15 (24 and 25) from both sides of the laminated structure in its laminating direction. The plate thickness of the block member 14 (24) is greater than the thickness in the laminating direction of the laminated structure consisting of the semiconductor chip 11 (21) and the insulating substrates 12 and 13 (22 and 23).

Figure 6:
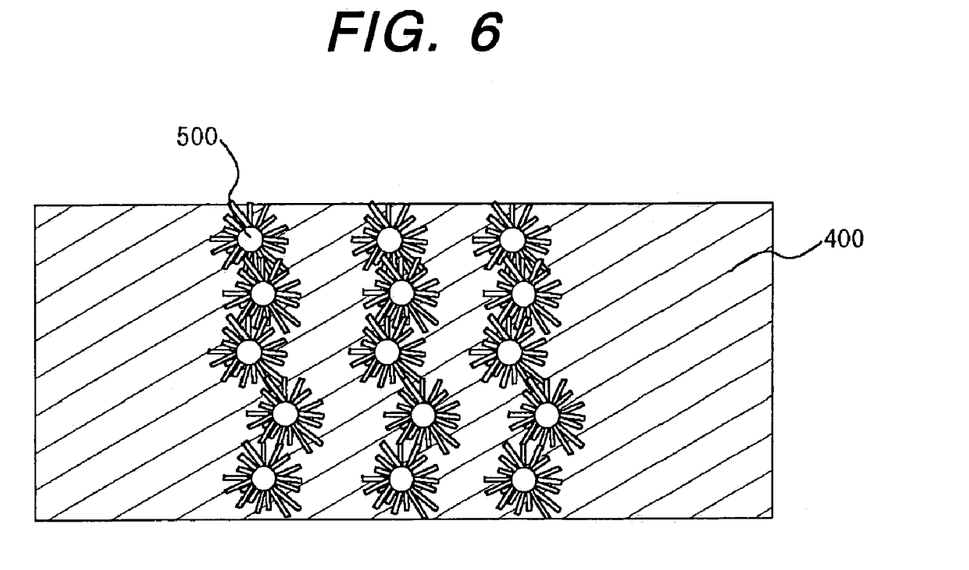
FIG. 6 is a cross-sectional view showing the materials composition of the electroconductive adhesive agent used to connect two components of the inverter device of FIG. 1.
Figure 7:
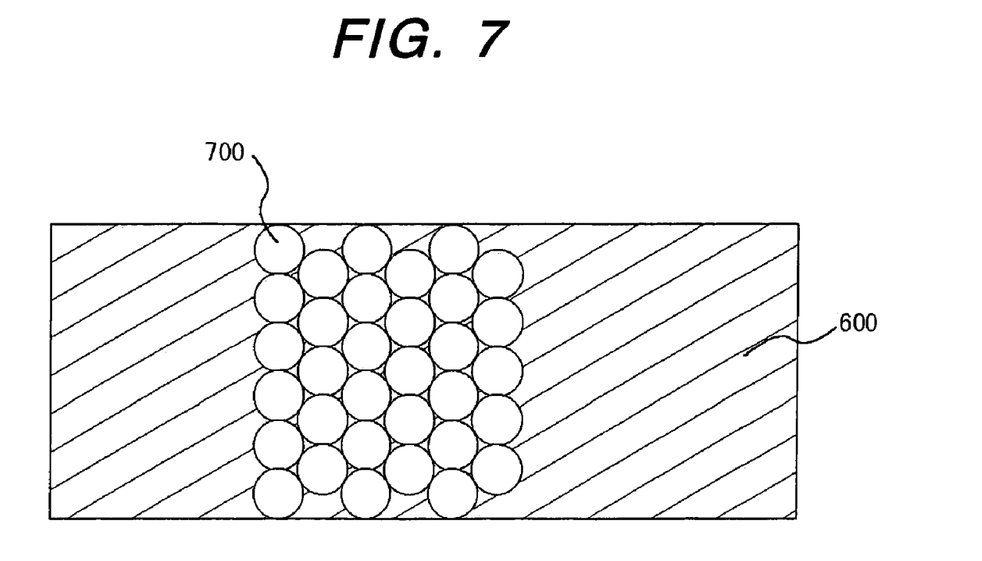
FIG. 7 is a cross-sectional view showing the materials composition of an electroconductive adhesive agent as a comparative example of FIG. 6.

The electroconductive adhesives 18, 19, 28, and 29 are each a mixture of metallic pieces (metallic filler) or metal particles and resin. FIG. 6 shows the cross-sectional structure of applied and cured electroconductive adhesives 18, 19, 28, and 29 in the present embodiment. In the present embodiment, mixtures of epoxy resin 400 and silver particles 500 having needle-like protrusions are used as the electroconductive adhesives 18, 19, 28, and 29. As is obvious from the figure, in the electroconductive adhesives 18, 19, 28, and 29 of the present embodiment, adjoining silver particles 500 are closely intermixed in the epoxy resin 400 and at the same time, the inside of the protrusions of the silver particles 500 is filled with the epoxy resin 400 so as not to create a clearance.

Compared with an electroconductive adhesive formed by mixing a global metallic filler with resin, the electroconductive adhesives 18, 19, 28, and 29 in the present embodiment enable high electroconductivity to be achieved only by adding a small amount of metallic pieces or metal particles, and at the same time, high mechanical strength to be obtained. That is to say, to achieve electroconductivity equal to that used in the present embodiment, the electroconductive adhesive in which a global-metallic filler 700 and resin 600 are mixed (see FIG. 7) must be filled with the metallic filler so as not to create a clearance.

However, since the amount of resin decreases correspondingly, mechanical strength will also decrease. Accordingly, to achieve high electroconductivity with a small amount of metallic pieces or metal particles and also to obtain high mechanical strength, it is preferable that such electroconductive adhesives 18, 19, 28, and 29 as used in the present embodiment should be used.

Examples of the electroconductive adhesives which contain a metallic filler having needle-like protrusions are introduced in the July 2001 Number of "Electronic Materials" that features electroconductive adhesives on pages 89–96.

Since it is low in both impedance and thermal resistance, the solder commonly used for bonding two members of laminated structure is excellent in electroconductivity and heat conductivity. For an inverter device that releases heat from both faces of each semiconductor chip, thermal fatigue exerted on the surface of the solder can also be reduced by distributing the thermal stress.

However, as in the present embodiment, in the case of two-member connection of the inverter device in which, as the standards pertaining to power supplies are tightened, the magnitude of the current flowing through semiconductor-devices further increases during automobile-mounted use under a severe heat-cycle environment, especially in the connection of a ceramic insulating substrate and a copper block member, there is the fear that the significant difference in linear expansion coefficient between both will exert thermal fatigue on the surface of the soldered connection and result in rupture stemming from this surface.

For this reason, a bonding agent as low as solder in terms of both impedance and thermal resistance and higher than solder in terms of mechanical strength is required as a bonding agent alternative to solder.

In the present embodiment, therefore, such electroconductive adhesive as described above is used for two-member connection. Accordingly, in the present embodiment, in two-member connection of the inverter device in which, as the standards pertaining to power supplies are tightened, the magnitude of the current flowing through semiconductor devices further increases during automobile-mounted use under a severe heat-cycle environment, even if the difference in linear expansion coefficient between the two members is significant, thermal fatigue exerted on the surface of the connection can be reduced and the inverter device can be stably operated under a severe heat-cycle environment.

In the present embodiment, therefore, the reliability of the inverter device can be improved. In the present embodiment, since the inverter device is constructed so that heat is released from both faces of each semiconductor chip, it is also possible to further reduce the thermal fatigue exerted on the surface of the connection, and to further improve the reliability of the inverter device.

Although, in the present embodiment, an example in which an electroconductive adhesive is used for connection between the insulating substrates 12, 13, 22, and 23, and the block members 14, 15, 24, and 25, has been described, the electroconductive adhesive can also be used for connection between the insulating substrates 12 and 22 (13 and 23) and the wiring pattern 8 (9), between the source electrode 2 and source electrode connecting member 4 of the silicon chip 1, and between other sections. Hereby, the reliability of the inverter device can be further improved.

Figure 1:
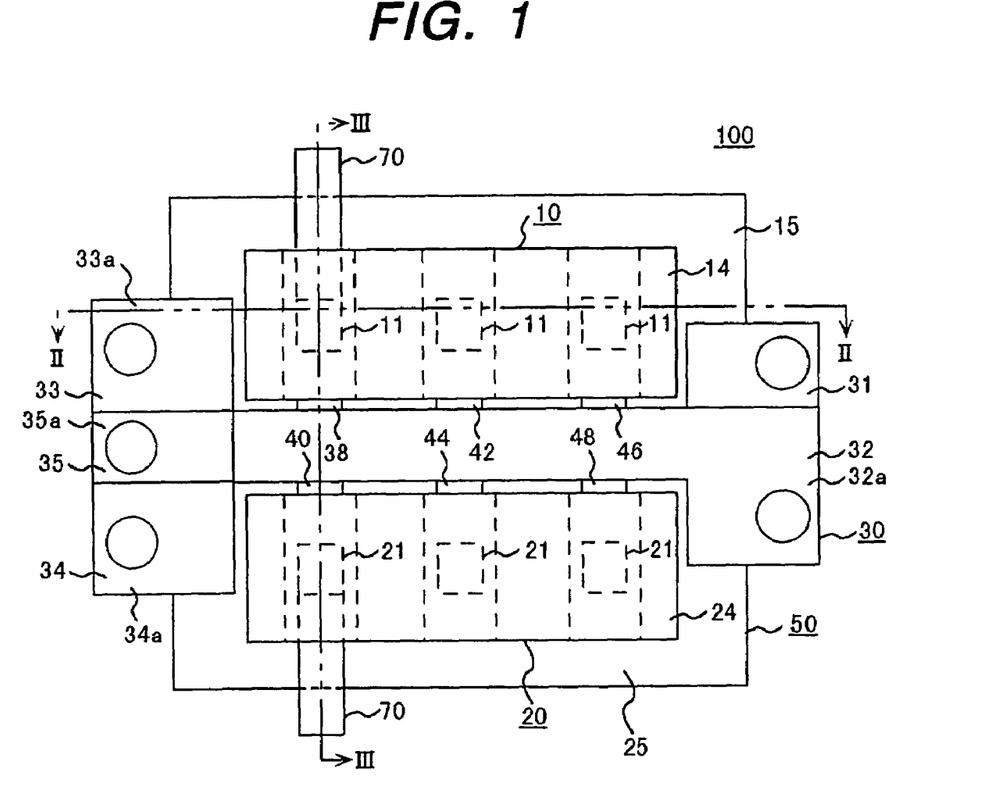
FIG. 1 is a top plan view showing the configuration of an inverter device as a first embodiment of the present invention.
Figure 2:
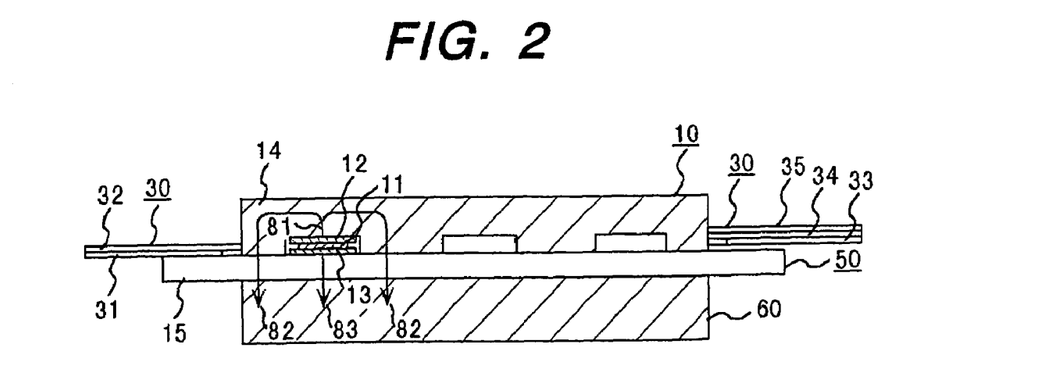
FIG. 2 is a cross-sectional view of the section II–II' when seen from the direction of the arrow in FIG. 1.
Figure 3:
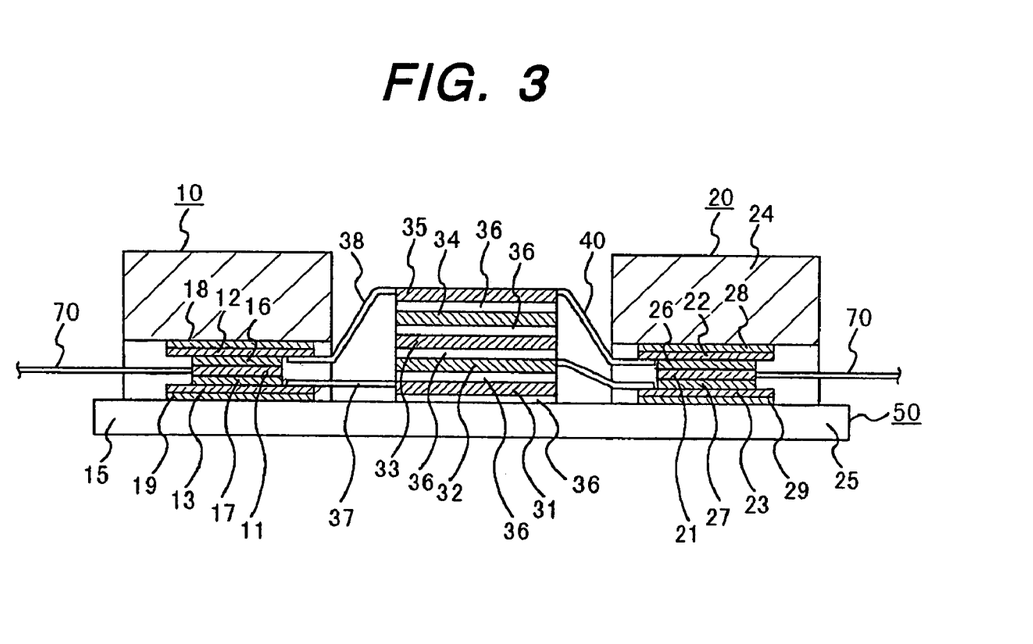
FIG. 3 is a cross-sectional view of the section III–III' when seen from the direction of the arrow in FIG. 1.

The busbar 30 is formed between the positive-pole semiconductor module 10 and the negative-pole semiconductor module 20, and in the center of the base 50, by laminating the positive-pole DC busbar 31, the negative-pole DC busbar 32, the w-phase busbar 33, the v-phase busbar 34, and the u-phase busbar 35, in that order, from bottom. An insulating member 36 for electrically insulating the contact surfaces between these sections is provided between the base 50 and the busbar 30 and between other busbars. The positive-pole DC busbar 31 and the negative-pole DC busbar 32 are equivalent to input wiring. The w-phase busbar 33, the v-phase busbar 34, and the u-phase busbar 35 are equivalent to output wiring.

An external connection terminal section 31a is formed at one end of the positive-pole DC busbar 31 in its second section. An external connection terminal section 32a is formed at one end of the negative-pole DC busbar 32 in its second section.

An external connection terminal section 35a is formed at the other end of the u-phase busbar 35 in its second section. An external connection terminal section 34a is formed at the other end of the v-phase busbar 34 in its second section. An external connection terminal section 33a is formed at the other end of the w-phase busbar 33 in its second section.

In the busbar 30 that is configured into laminated structure as in the present embodiment, the current to the inverter circuit alternately flows and the magnetic fields generated by the alternately flowing current offset one another. Hereby, in the present embodiment, the reactance parasitic on the inverter circuit decreases and the overvoltage applied to the semiconductor chips 11 and 21 during large-current switching is suppressed. According to the present embodiment, therefore, the reliability of the inverter device 100 can be improved.

Although, in the present embodiment, an example of laminating the busbar components in the order mentioned above has been described, the lamination of the busbar components is not limited to the above-mentioned order and there is no problem even if the w-phase busbar 33, the v-phase busbar 34, and the u-phase busbar 35, the negative-pole DC busbar 32, and the positive-pole DC busbar 31 are laminated in that order from bottom.

In this case, however, it is preferable that the top and bottom of each semiconductor 11 (silicon chip 1) in the positive-pole semiconductor module 10 and the top and bottom of each semiconductor 21 (silicon chip 1) in the negative-pole semiconductor module 20 should be inverted to prevent intercrossing between the connecting members described later.

One end of a connecting conductor 37 is solder-connected to the wiring pattern 9 of the insulating substrate 13 which is connected to the bottom only of the semiconductor chip 11, among all three semiconductor chips 11 shown in FIG. 1, that is positioned at the left side in the second direction.

The other end of the connecting conductor 37 is solder-connected to the positive-pole DC busbar 31. By these connections, the drain electrode 5 of the corresponding semiconductor chip 11 and the positive-pole DC busbar 31 are electrically connected. One end of a connecting conductor 38 is solder-connected to the wiring pattern 8 of the insulating substrate 12 which is connected to the top of the corresponding semiconductor chip 11.

The other end of the connecting conductor 38 is solder-connected to the u-phase AC busbar 35. By these connections, the base electrode 2 of the corresponding semiconductor chip 11 and the u-phase AC busbar 35 are electrically connected. The connecting conductors 37 and 38 are flat-plate-like electroconductive members made of a metal (for example, copper).

One end of a connecting conductor 39 is solder-connected to the wiring pattern 9 of the insulating substrate 23 which is connected to the bottom only of the semiconductor chip 21, among all three semiconductor chips 21 shown in FIG. 1, that is positioned at the left side in the second direction. The other end of the connecting conductor 39 is solder-connected to the negative-pole DC busbar 32.

By these connections, the base electrode 2 of the corresponding semiconductor chip 21 and the negative-pole DC busbar 32 are electrically connected. One end of a connecting conductor 40 is solder-connected to the wiring pattern 8 of the insulating substrate 22 which is connected to the top of the corresponding semiconductor chip 21.

The other end of the connecting conductor 40 is solder-connected to the u-phase AC busbar 35. By these connections, the drain electrode 5 of the corresponding semiconductor chip 21 and the u-phase AC busbar 35 are electrically connected. The connecting conductors 39 and 40 are flat-plate-like electroconductive members made of a metal, for example, copper.

One end of a connecting conductor 41 is solder-connected to the wiring pattern 9 of the insulating substrate 13 which is connected to the bottom only of the semiconductor chip 11, among all three semiconductor chips 11 shown in FIG. 1, that is positioned centrally in the second direction. The other end of the connecting conductor 41 is solder-connected to the positive-pole DC busbar 31. By these connections, the drain electrode 5 of the corresponding semiconductor chip 11 and the positive-pole DC busbar 31 are electrically connected.

One end of a connecting conductor 42 is solder-connected to the wiring pattern 8 of the insulating substrate 12 which is connected to the top of the corresponding semiconductor chip 11. The other end of the connecting conductor 42 is solder-connected to the v-phase AC busbar 34. By these connections, the base electrode 2 of the corresponding semiconductor chip 11 and the v-phase AC busbar 34 are electrically connected. The connecting conductors 41 and 42 are flat-plate-like electroconductive members made of a metal, for example, copper.

One end of a connecting conductor 43 is solder-connected to the wiring pattern 9 of the insulating substrate 23 which is connected to the bottom only of the semiconductor chip 21, among all three semiconductor chips 21 shown in FIG. 1, that is positioned centrally in the second direction.

The other end of the connecting conductor 43 is solder-connected to the negative-pole DC busbar 32. By these connections, the base electrode 2 of the corresponding semiconductor chip 21 and the negative-pole DC busbar 32 are electrically connected. One end of a connecting conductor 44 is solder-connected to the wiring pattern 8 of the insulating substrate 22 which is connected to the top of the corresponding semiconductor chip 21.

The other end of the connecting conductor 44 is solder-connected to the v-phase AC busbar 34. By these connections, the drain electrode 5 of the corresponding-semiconductor chip 21 and the v-phase AC busbar 34 are electrically connected. The connecting conductors 43 and 44 are flat-plate-like electroconductive members made of a metal, for example, copper.

One end of a connecting conductor 45 is solder-connected to the wiring pattern 9 of the insulating substrate 13 which is connected to the bottom only of the semiconductor chip 11, among all three semiconductor chips 11 shown in FIG. 1, that is positioned at the right side in the second direction. The other end of the connecting conductor 45 is solder-connected to the positive-pole DC busbar 31. By these connections, the drain electrode 5 of the corresponding semiconductor chip 11 and the positive-pole DC busbar 31 are electrically connected.

One end of a connecting conductor 46 is solder-connected to the wiring pattern 8 of the insulating substrate 12 which is connected to the top of the corresponding semiconductor chip 11. The other end of the connecting conductor 46 is solder-connected to the w-phase AC busbar 33. By these connections, the base electrode 2 of the corresponding semiconductor chip 11 and the w-phase AC busbar 33 are electrically connected. The connecting conductors 45 and 46 are flat-plate-like electroconductive members made of a metal, for example, copper.

One end of a connecting conductor 47 is solder-connected to the wiring pattern 9 of the insulating substrate 23 which is connected to the bottom only of the semiconductor chip 21, among all three semiconductor chips 21 shown in FIG. 1, that is positioned at the right side in the second direction.

The other end of the connecting conductor 47 is solder-connected to the negative-pole DC busbar 32. By these connections, the base electrode 2 of the corresponding semiconductor chip 21 and the negative-pole DC busbar 32 are electrically connected.

One end of a connecting conductor 48 is solder-connected to the wiring pattern 8 of the insulating substrate 22 which is connected to the top of the corresponding semiconductor chip 21. The other end of the connecting conductor 48 is solder-connected to the w-phase AC busbar 33. By these connections, the drain electrode 5 of the corresponding semiconductor chip 21 and the w-phase AC busbar 33 are electrically connected. The connecting conductors 47 and 48 are flat-plate-like electroconductive members made of a metal (for example, copper).

As described above, in the present embodiment, exactly as the busbar 30 is disposed between the positive-pole semiconductor module 10 and the negative-pole semiconductor module 20, the positive-pole semiconductor module 10, the negative-pole semiconductor module 20, and the busbar 30 are arranged linearly in proximity.

According to this configuration, electrical connection between the positive-pole semiconductor module 10, the negative-pole semiconductor module 20, and the busbar 30, can be easily established by use of the connecting conductors 37 to 48. Hereby, in the present embodiment, the number of components of the inverter device 100 is reduced and the configuration of the inverter device 100 is simplified. According to the present embodiment, therefore, the inverter device 100 can be reduced in both dimensions and costs.

In addition, according to the present embodiment, since the laminating order of the elements constituting the busbar 30 is changed according to the particular configuration of the positive-pole semiconductor module 10 and the negative-pole semiconductor module 20, the connecting conductors 37 to 48 do not cross one another between the positive-pole semiconductor module 10, the negative-pole semiconductor module 20, and the busbar 30.

At the gate electrode 6 of the semiconductor chip 11 (21), a wiring member 70 that has been inserted from the sections of the block members 14 and 24 that are holed in the first direction of the busbar 30, at the opposite side thereof, is connected by a metallic ball 71. Hereby, the wiring member 70 is electrically connected to the date electrode 6.

The wiring member 70 is a thin-plate-like or sheet-like signal-transmitting member that applies gate control signals 151 (switching control signals for turning on and off the MOS-FETs 171–173 and 181–183) from the control circuit block 150 to the gates of the MOS-FETs. More specifically, the wiring member 70 is either an electroconductive member covered with a resin film or an electroconductive member attached to one side of a resin film. The resin film is a flexible film formed from insulating resin. The metallic ball 71 is a global, electroconductive, and adhesive member formed from solder.

In the present embodiment, such wiring connection as described above is used to connect the gate electrode 6 and the wiring member 70. This is because, since, the position of the gate electrode 6 in the area surrounded by the guard ring 7 provided on one face of the top or bottom of the silicon chip 1 is outer than that of the source electrode 2, it is necessary to ensure the required distance not affecting the electric field design of the guard ring 7, and at the same time to perform the wiring connection to the gate electrode 6.

Also, in the present embodiment, in order to enable the above-described wiring connection, electrical connection between the source electrode 2 and the wiring patterns 8 and 9 of the insulating substrates 12 and 23 is achieved using the following method:

That is to say, the source electrode 2 and the wiring patterns 8 and 9 of the insulating substrates 12 and 23 are electrically connected via the source electrode connecting member 4. And the size of the connection surface of the source electrode connecting member 4 is limited to the size of the electrode surface of the source electrode 2 so that a wiring connection space can be obtained between the wiring member 70 and the gate electrode 6.

Also, the source electrode connecting member 4 has a plate thickness that enables the necessary isolation distance to be obtained between the guard ring 7 and the wiring member 70. Hereby, the necessary space for wiring connection is ensured between the silicon chip 1 and the insulating substrates 12 and 23.

In the present embodiment, the case that the gate electrode 6 and the wiring member 70 are connected by such wiring connection as described above has been set forth. However, if, in the area surrounded by the guard ring 7, the gate electrode 6 is present at an inner position that that of the source electrode 2, the need may arise to connect the wiring patterns 8 and 9 of the insulating substrates 12 and 23 and the source electrode 2 without using the source electrode connecting member 4.

If this is the case, it is preferable that a method be used in which: one end of a lead-out line (electroconductive wire line) having the other end connected to the source electrode 2 is to be pulled out via a notch or hole provided in either the source electrode connecting member 4 or the insulating substrates 12 and 23, and while the necessary distance with respect to the guard ring 7 is being maintained, the lead-out line is to be pulled out and then connected to the wiring member 70.

According to the present embodiment heretofore described, since a heat-releasing channel is formed at both the top and bottom of the semiconductor chip 11 (21) by sandwiching this semiconductor chip 11 (21) between the insulating substrates 12 and 13 (22 and 23) and block members 14 and 15 (24 and 25) from both the top and bottom of the semiconductor chip 11 (21), and since the cross-sectional area of the heat flow section of the heat-releasing channel is extended by connecting the block member 14 (24) to the block member 15 (25) across the laminated structure formed by the semiconductor chip 11 (21) and the insulating substrates 12 and 13 (22 and 23), a heat stream 80 released from the top of the semiconductor chip 11 (21) and flowing in one direction towards the top of the laminating direction of the laminated structure is diffused to produce a heat stream 81 flowing in various directions with respect to the vertical face to the laminating direction of the laminated structure (in the figure, only the flow of heat in a perpendicular and horizontal direction with respect to the laminating direction of the laminated structure is shown). Subsequently, the heat stream 81 is transmitted to the block member 15 (25) and then released from a heat-releasing structure 60 to the outside together with a heat stream 82 which is released from the bottom of the semiconductor chip 11 (21) and flowing towards the bottom of the laminating direction of the laminated structure.

Hereby, in the present embodiment, the thermal resistance of both the positive-pole semiconductor module 10 and the negative-pole semiconductor module 20 can be significantly reduced and increases in the temperatures of both modules can also be significantly reduced. According to the present inventors, it has been possible to empirically verify that the thermal resistance of both the positive-pole semiconductor module 10 and the negative-pole semiconductor module 20 can be reduced to about ½ of the corresponding conventional value and that increases in the temperatures of both modules can also be reduced to about ½ of the corresponding conventional values (that is to say, cooling performance can be improved to about twice that of a conventional product).

According to the present embodiment, therefore, by adopting even more compact semiconductor chips 11 and 21, the positive-pole semiconductor module 10 and the negative-pole semiconductor module 20 can be dimensionally reduced and increases in the temperatures of both modules can be controlled to stay within the permissible temperature range of the semiconductor chips 11 and 21, even if the amount of current flowing thereinto is increased by the tightening of the standards relating to the battery 200, the power supply mounted in an automobile.

Accordingly, the present embodiment makes it possible to provide a highly reliable, compact, and inexpensive inverter device 100 whose normal operation can be maintained even when used under a severe heat-cycle environment.

In addition, according to the present embodiment, since the block member 14 (24) is formed into a bridge shape or an arch shape, the cross-sectional area of the heat flow section of the heat-releasing channel can be extended within the range that satisfies the automobile-mounting dimensions of the inverter device 100, without extending more than necessary the laminated structure, in its laminating direction or its vertical direction, that is formed by the semiconductor chip 11 (21) and insulating substrates 12 and 13 (22 and 23).

Although, an example in which the heat-releasing structure 60 is connected to the bottom of the base 50 has been described in the present embodiment, the thermal resistance of both the positive-pole semiconductor module 10 and the negative-pole semiconductor module 20 can be further reduced to about ½ of the corresponding conventional value by connecting a similar heat-releasing structure to the tops of the block members 14 and 24 as well.

Next, a second embodiment of the present invention is described below in accordance with FIGS. 9 to 12. FIGS. 9 to 12 show the circuit composition of an actual power conversion device. In the present embodiment, the configuration of the laminated structure inserted between the block members 14 and 15 (24 and 25) in the positive-pole semiconductor module 10 (negative-pole semiconductor module 20) differs from the configuration described in the first embodiment.

Figure 12:
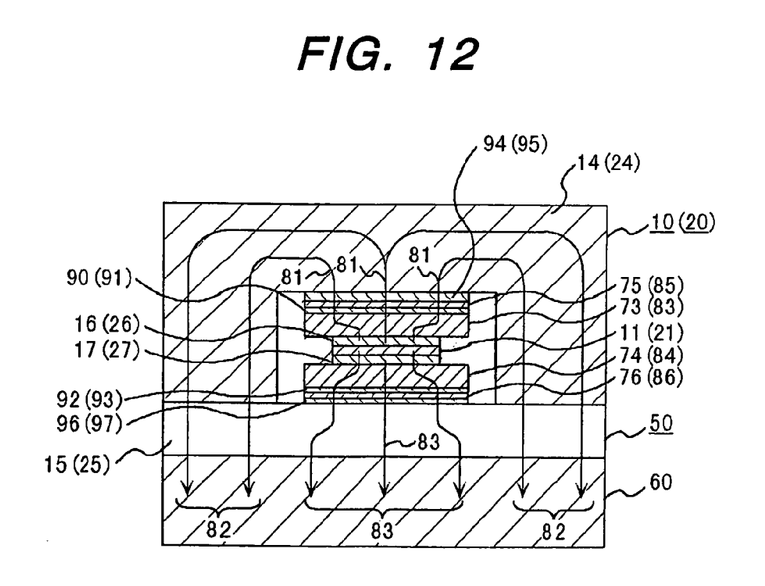
FIG. 12 is a cross-sectional view showing in enlarged form the configuration of one phase in FIG. 10.

In the second embodiment, the laminated structure made up of the semiconductor chip 11 (21), the electroconductive members 73 and 74 (83 and 84), and the insulating members 75 and 76 (85 and 86), is sandwiched between block members 14 and 15 (24 and 25) under a positional relationship similar to that of the first embodiment. The electroconductive members 73, 74, 83, and 84 are flat-plate-like members made of a metal (for example, copper). The insulating members 75, 76, 85, and 86 are ceramic flat-plate-like members formed from a material high in heat conductivity, such as an aluminum nitride material.

The side of the electroconductive member 73 that faces the top of the semiconductor chip 11 is connected to the top (source electrode connecting member 4) thereof via solder 16 so as to ensure electrical connection to the source electrode connecting member 4. The side of the electroconductive member 74 that faces the bottom of the semiconductor chip 11 is connected to the bottom thereof (more exactly, the bottom of the silicon chip 1) via solder 17 so as to ensure electrical connection to the drain electrode 5.

The side of the electroconductive member 83 that faces the top of the semiconductor chip 21 is connected to the top (silicon chip 1) thereof via solder 26 so as to ensure electrical connection to the drain electrode 5. The side of the electroconductive member 84 that faces the bottom of the semiconductor chip 21 is connected to the bottom (source electrode connecting member 4) thereof via solder 27 so as to ensure electrical connection to the source electrode connecting member 4.

The side of the insulating member 75 (85) that faces the opposite side of the electroconductive member 73 (83) with respect to the semiconductor chip 11 (21) is connected via an electroconductive adhesive 90 (91) to the opposite side of the electroconductive member 73 (83) with respect to the semiconductor chip 11 (21). The side of the insulating member 76 (86) that faces the opposite side of the electroconductive member 74 (84) with respect to the semiconductor chip 11 (21) is connected via an electroconductive adhesive 92 (93) to the opposite side of the electroconductive member 74 (84) with respect to the semiconductor chip 11 (21). The electroconductive adhesive 90 to 93 are created from the same material as that of the first embodiment, so as to have the same construction as that of the first embodiment.

The side of the block member 14 (24) that faces the opposite side of the insulating member 75 (85) with respect to the electroconductive member 73 (83) is connected via an electroconductive adhesive 94 (95) to the opposite side of the insulating member 75 (85) with respect to the semiconductor chip 11 (21).

The side of the block member 15 (25) that faces the opposite side of the insulating member 76 (86) with respect to the electroconductive member 74 (84) is connected via an electroconductive adhesive 96 (97) to the opposite side of the insulating member 76 (86) with respect to the semiconductor chip 11 (21).

Figure 9:
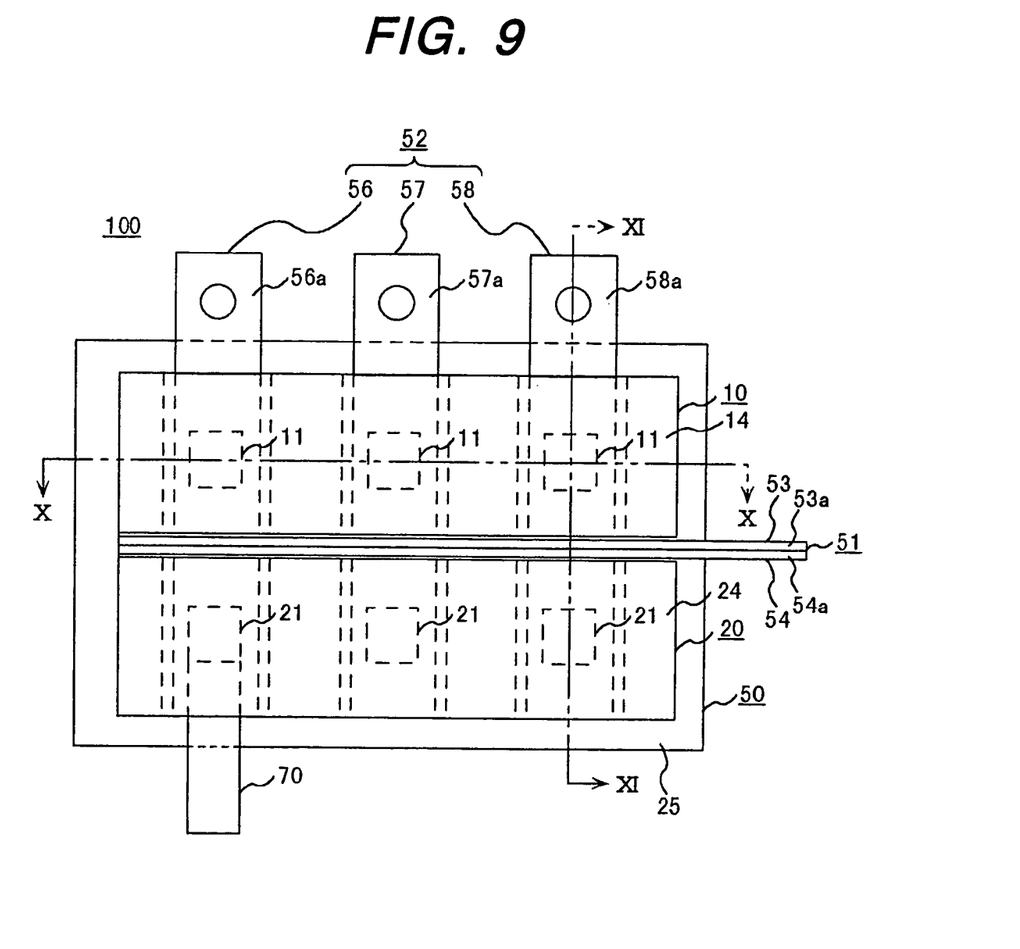
FIG. 9 is a top plan view showing the configuration of another inverter device as a second embodiment of the present invention.
Figure 10:
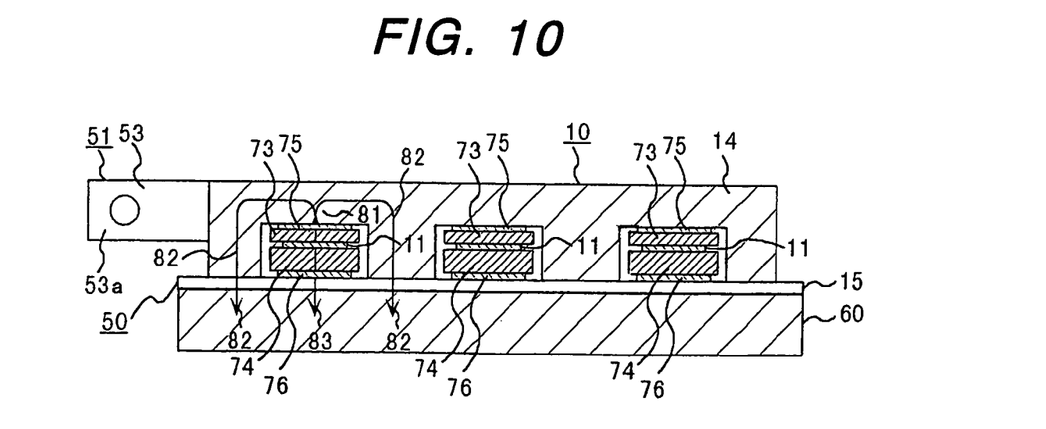
FIG. 10 is a cross-sectional view of the section X–X' when seen from the direction of the arrow in FIG. 9.
Figure 11:
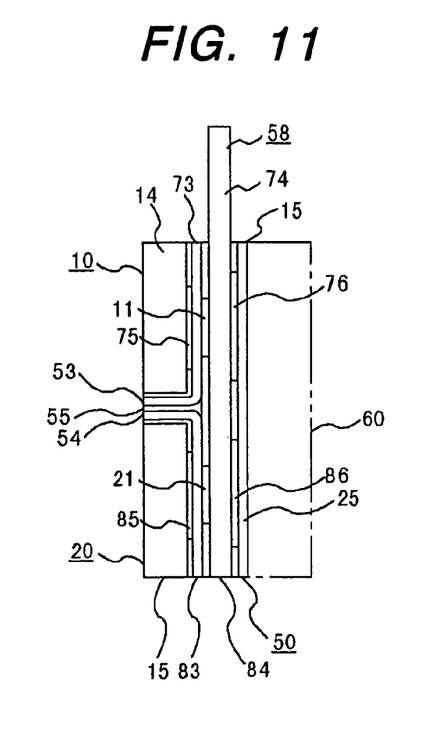
FIG. 11 is a cross-sectional view of the section XI–XI' when seen from the direction of the arrow in FIG. 9.

The configuration of busbars in the present embodiment differs from the configuration of the first embodiment. In the present embodiment, the busbars are divided into DC-use busbars 51 that constitute input wiring, and AC-use busbars 52 that constitute output wiring, and these two types of busbars are arranged so as to be orthogonal with respect to one another. The DC-use busbars 51 consist of a positive-pole DC busbar 53 and a negative-pole DC busbar 54, which are arranged between the linearly provided structure constituted by the positive-pole semiconductor module 10 and the negative-pole semiconductor module 20.

The positive-pole DC busbar 53 consists of the electroconductive member 73 and is formed from a flat-plate-like first section extending from the positive-pole semiconductor module 10 towards the negative-pole semiconductor module 20 with respect to the direction of arrangement of both modules (hereinafter, this direction is referred to as a third direction), and a flat-plate-like section extending in a right-angle direction (hereinafter, referred to as a fourth direction) with respect to both the extending direction of the first section and the direction of arrangement of the positive-pole semiconductor module 10 and the negative-pole semiconductor module 20, between the linearly provided structure of the positive-pole semiconductor module 10 and negative-pole semiconductor module 20 (in other words, between the block members 14 and 24), in such a manner that the cross section in the fourth direction has a shape of L. An external connection terminal section 53a is formed at one end of the positive-pole DC busbar 53 in its fourth direction.

The negative-pole DC busbar 54 consists of the electroconductive member 83 and is formed from a flat-plate-like first section extending from the negative-pole semiconductor module 20 towards the positive-pole semiconductor module 10 with respect to the third direction, and a flat-plate-like section extending in the fourth direction at right angles with respect to the extending direction of the first section, between the linearly provided structure of the positive-pole semiconductor module 10 and negative-pole semiconductor module 20 (in other words, between the block members 14 and 24), in such a manner that the cross section in the fourth direction has a shape of L. The second section of the positive-pole DC busbar 53 and that of the negative-pole DC busbar 54 overlap in the third direction via an insulating member 55. An external connection terminal section 54a is formed at one end of the negative-pole DC busbar 54 in its fourth direction.

The AC-use busbars 52 consist of a u-phase busbar 56, a v-phase busbar 57, and a w-phase busbar 58. The u-phase busbar 56, the v-phase busbar 57, and the w-phase busbar 58 are formed by integrating the electroconductive member 74 of the positive-pole semiconductor module 10 and the electroconductive member 84 of the negative-pole semiconductor module 20 for each corresponding phase, and each of the three busbars is a fat-plate-like structure extending from the negative-pole semiconductor module 20 towards the positive-pole semiconductor module 10 with respect to the third direction, and protruding from the positive-pole semiconductor module 10 towards the opposite side with respect to the negative-pole semiconductor module 20.

An external connection terminal section 56a is formed at the section of the u-phase AC busbar 56 that protrudes from the positive-pole semiconductor module 10 towards the opposite side with respect to the negative-pole semiconductor module 20. An external connection terminal section 57a is formed at the section of the v-phase AC busbar 57 that protrudes from the positive-pole semiconductor module 10 towards the opposite side with respect to the negative-pole semiconductor module 20.

An external connection terminal section 58a is formed at the section of the w-phase AC busbar 58 that protrudes from the positive-pole semiconductor module 10 towards the opposite side with respect to the negative-pole semiconductor module 20.

Structurally, other sections are the same as those of the first embodiment, and are therefore assigned the same numerals as those used in the first embodiment. For these reasons, description of other sections is omitted.

According to the present embodiment heretofore described, since similarly to the first embodiment, a double-sided heat-releasing channel is formed and the cross-sectional area of its heat flow section is extended, it is possible, similarly to the first embodiment, to reduce the thermal resistance of both the positive-pole semiconductor module 10 and the negative-pole semiconductor module 20 to about ½ of the corresponding conventional value, to reduce increases in the temperatures of the positive-pole semiconductor module 10 and the negative-pole semiconductor module 20 to about ½ of the corresponding conventional values, and thus, similarly to the first embodiment, to reduce the dimensions of the positive-pole semiconductor module 10 and the negative-pole semiconductor module 20 and suppress increases in the temperatures of both modules.

Accordingly, the present embodiment also makes it possible to provide a highly reliable, compact, and inexpensive inverter device 100 whose normal operation can be maintained even when used under a severe heat-cycle environment.

According to the present embodiment, since the DC-use busbars 51 are constituted using the electroconductive members 73 and 83 which constitute the positive-pole semiconductor module 10 and the negative-pole semiconductor module 20, and since the AC-use busbars 52 are constituted using the electroconductive members 74 and 84 which constitute the positive-pole semiconductor module 10 and the negative-pole semiconductor module 20, it is also possible to reduce the number of components, compared with that of the first embodiment, and simplify the configuration of the inverter device 100.

According to the present embodiment, therefore, it is possible to provide an even more compact and less expensive inverter device 100 than that of the first embodiment.

The reference sign mean the following parts:
10 . . . Positive-pole semiconductor module, 11, 21 . . . Semiconductor chips, 12, 13, 22, 23 Insulating substrates, 14, 15, 24, 25 . . . Block members, 20 . . . Negative-pole semiconductor module, 30 . . . Busbar, 51 . . . DC-use busbar, 52 . . . AC-use busbar, 60 . . . Heat-releasing member, 73, 74, 83, 84 . . . Electroconductive members, 75, 76, 85, 86 . . . Insulating members.

According to the present embodiment described above, it is possible to provide a semiconductor module whose cooling performance can be improved. According to the present embodiment, it is also possible to provide a highly reliable, compact, and inexpensive inverter device whose normal operation can be maintained even when used under a severe heat-cycle environment.

What is claimed is:

1. A semiconductor module comprising:
a semiconductor device having electrodes at both surfaces thereof;
insulating substrates electrically connected to respective ones of said electrodes, each of said insulating substrates being provided with wiring electrically connected to corresponding electrodes of said semiconductor device, whereby said semiconductor device and said insulating substrate form a laminated structure section;
a block member made of electrically conductive metal;
first means for connecting one face of said block member to one face of said laminated structure section;
a heat releasing structure provided on the other face of said block member;
a metallic thermal-conductive member;
second means for connecting said thermal conductive member to the other face of the laminated structure section within a cavity formed in said thermal-conductive member;
wherein, each of said first and second means consists of an electrically conductive adhesive;
wherein, said thermal-conductive member has a portion that surrounds the cavity and is connected to said block member;
wherein, the laminated structure section is confined within the cavity in such a manner that side faces of the laminated structure section do not touch the block member and the thermal-conductive member;
whereby a heat stream from the top of the laminated structure is released through the thermal-conductive member to said block member and said heat releasing structure.

2. A semiconductor module according to claim 1, wherein said electrically conductive adhesive comprises metallic pieces or metallic particles mixed with resin.

3. A semiconductor module according to claim 2, wherein said metallic pieces or said metallic particles have needle-like or petal-like protrusions and said protrusions are in close contact with each other in said resin.

* * * * *